United States Patent [19]
Nam

[11] Patent Number: 6,133,109
[45] Date of Patent: Oct. 17, 2000

[54] METHOD FOR MANUFACTURING A DRAM CELL CAPACITOR

[75] Inventor: Seok-Woo Nam, Seoul, Rep. of Korea

[73] Assignee: Samsung Electronics Co., Ltd., Suwon, Rep. of Korea

[21] Appl. No.: 09/221,605

[22] Filed: Dec. 29, 1998

[30] Foreign Application Priority Data

Dec. 29, 1997 [KR] Rep. of Korea ........................ 97-77274
Aug. 4, 1998 [KR] Rep. of Korea ........................ 98-31668

[51] Int. Cl.$^7$ .................................................. H01L 21/20
[52] U.S. Cl. ........................... 438/396; 438/255; 438/398
[58] Field of Search ..................................... 438/398, 253, 438/255, 396

[56] References Cited

U.S. PATENT DOCUMENTS 5,385,863 1/1995 Tatsumi et al. .
5,937,307 8/1999 Jenq et al. ............................... 438/398

*Primary Examiner*—Tuan H. Nguyen
*Attorney, Agent, or Firm*—Jones Volentine, LLC

[57] ABSTRACT

A method of manufacturing a DRAM cell capacitor is provided wherein a capacitor storage electrode is covered with an HSG (Hemi-Spherical Grain) silicon layer to increase capacitance, but the HSG silicon layer is not formed on the top edge of the capacitor storage electrode.

5 Claims, 12 Drawing Sheets

METHOD FOR MANUFACTURING A DRAM CELL CAPACITOR

BACKGROUND OF THE INVENTION

The present invention relates to a dynamic random access memory (DRAM) cell capacitor. More particularly, the present invention relates to a method for manufacturing the a memory cell capacitor having increased capacitance by forming an Hemi-Spherical Grain (HSG) layer on a surface of a memory cell storage electrode.

As DRAMs increase in memory cell density, the space allocated for each memory cell of the DRAM decreases. This result continuously challenges DRAM designers, since memory cell capacitance decreases with area, all other conditions remaining constant. Many efforts have been made to maintain memory cell capacitance at a sufficiently high storage capacitance, despite decreasing memory cell size.

For example, U.S. Pat. No. 5,385,863 issued Jan. 31, 1995 to Tatsumi entitled "METHOD OF MANUFACTURING POLYSILICON FILM INCLUDING RECRYSTALLIZATION OF AN AMORPHOUS FILM," discloses a conventional DRAM cell capacitor structure and manufacturing method for same. The reference is incorporated herein by reference. As shown this reference, HSG silicon is grown on a capacitor storage electrode having a simple "staked" structure in order to increase capacitance per unit area of the memory cell.

FIG. 1 shows a conventional DRAM cell capacitor. Referring to FIG. 1, the DRAM cell capacitor includes a semiconductor substrate 10 having active and inactive regions as defined by a field oxide layer 12. A pad electrode 14 is formed on the active region of substrate 10. An interlayer insulating layer 16 (with component portions 16a and 16b) is formed over field oxide layer 12 and pad electrode 14. A contact hole 19 is formed through interlayer insulating layer 16 to an upper surface of pad electrode 14. A conductive layer is then deposited on interlayer insulating layer 16 to fill contact hole 19. The conductive layer is then patterned to form a capacitor storage electrode 20. As storage electrode 20 is formed, an upper surface of the storage electrode 20 is perpendicular to each of its sidewalls.

Next, an HSG silicon layer 22 is formed on capacitor storage electrode 20 to increase an effective surface area. Subsequently, so as to accomplish fabrication of the DRAM cell capacitor, the process steps for sequentially forming a dielectric layer and a capacitor plate electrode on the capacitor storage electrode are performed.

Prior to forming the dielectric layer (not shown) over storage electrode 20, a wet etching and washing process are performed to remove a portion of interlayer insulating layer 16b and to prepare the surface. Generally, the etching process of interlayer insulating layer 20 uses an enchant that includes a mixture of $NH_4F$ and HF (which is called a "La1 solution" in the art), and a mixture of $NH_3$, $H_2O_2$ and deionized water (which is called an "SC-1 solution"), and the washing process uses an enchant that is a mixture of the SC-1 solution and HF.

During the etching process using the SC-1 solution, a portion of HSG silicon layer 22 which is formed on storage electrode 20, i.e., the portion on the top edges of storage electrode 20, is susceptible to lifting. When this happens, adjacent capacitor storage electrodes may be electrically connected 24 (i.e., short-circuited) one to another by the lifted HSG silicon. More particularly, lifting of the HSG silicon from the storage electrode is caused by at least one of the following reasons: (1) HSG silicon which has abnormally grown due to the remaining polymers is lifted during the etching process of the storage electrode, and/or (2) HSG silicon grown on the top edges of the storage electrode is lifted by the subsequent etching and washing processes.

A short-circuit of adjacent storage electrodes due to the lifted HSG silicon is shown in FIGS. 2A and 2B. FIG. 2A is a scanning electron microphotograph (SEM) showing a plan view of a conventional DRAM cell capacitor array. FIG. 2B is a SEM showing a perspective view of the conventional DRAM cell capacitor array shown in FIG. 2A. As is apparent from FIGS. 2A and 2B, after formation of the storage electrodes, a short-circuit between adjacent storage electrodes is formed by HSG silicon which has lifted from the top edges of the respective storage electrodes. This leads to the failure of the DRAM devices.

SUMMARY OF THE INVENTION

The present invention provides a method for manufacturing a DRAM cell capacitor, wherein HSG silicon is not formed on the top edges of a storage electrode. By preventing HSG silicon from forming on the top edges of a storage electrode, short-circuits due to lifted HSG silicon are avoided between adjacent storage electrodes.

In one aspect the present invention provides a method of manufacturing a storage electrode for a DRAM cell capacitor, the storage electrode being formed on an interlayer insulating layer and being electrically connected to a pad electrode formed on a semiconductor substrate through a contact hole in the interlayer insulating layer, comprising amorphous silicon the method comprising the steps of; forming a conductive layer over the interlayer insulating layer, defining first and second regions on the conductive layer, within the second region, converting the conductive layer into polysilicon, forming a first photoresist pattern over the conductive layer to cover the entire first region and a first portion of the second region proximate the first region, etching the conductive layer using the first photoresist pattern as a mask to form the storage electrode having sidewalls, an upper surface, and a polysilicon edge portion proximate the joining of the upper surface and sidewalls corresponding to the first portion of the second region, and forming an HSG silicon layer over the upper surface and sidewalls of the storage electrode, wherein the HSG silicon layer is not formed over the polysilicon edge portion.

The step of defining the first and second regions of the conductive layer may comprise the step of forming a second photoresist pattern over the conductive layer, and the step of converting the conductive layer into polysilicon may comprise the step of irradiating the second region of the conductive layer with a high energy beam using the second photoresist pattern as a mask.

Alternatively, the step of defining the first and second regions of the conductive layer may comprise the step of forming a CR pattern over the conductive layer, and the step of converting the second region of the conductive layer into polysilicon may comprise the step of irradiating the second region of the conductive layer with an E-beam using the CR pattern as a mask.

BRIEF DESCRIPTION OF THE DRAWINGS

This invention with it attendant advantages may be better understood upon review of the following detailed description of the preferred embodiments with reference to the accompanying drawings in which.

DETAILED DESCRIPTION OF THE PREFERRED EMBODIMENTS

Figure 3:
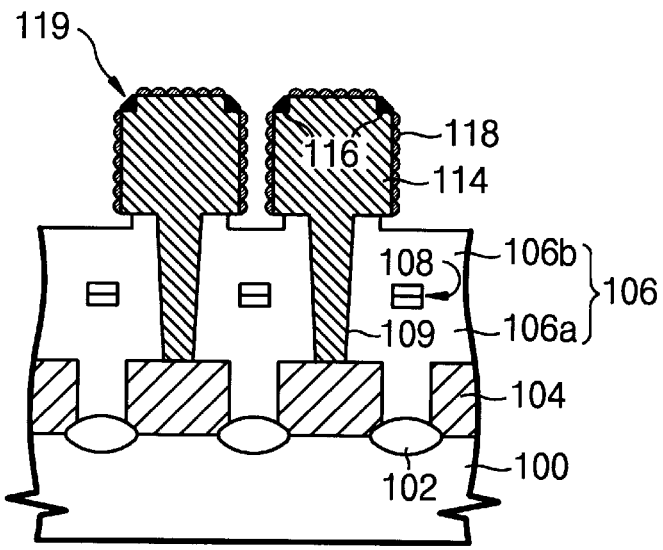
FIG. 3 is a cross-sectional view of a novel DRAM cell capacitor having an angled shape at its top edges according to the present invention.

Referring to FIG. 3, a DRAM cell capacitor formed in accordance with an embodiment of the present invention includes a semiconductor substrate 100 having active and inactive regions defined by a field oxide layer 102. A pad electrode 104 is formed on an active region of substrate 100. An interlayer insulating layer 106 (comprising constituent layer portions 106a and 106b) is formed over field oxide layer 102 and pad electrode 104. A bit line 108 is formed within interlayer insulating layer 106. A contact hole 109 is formed through interlayer insulating layer 106 to an upper surface of pad electrode 104. A conductive layer is then deposited on interlayer insulating layer 106 filling contact hole 109. The conductive layer is then patterned to form a storage electrode 114. Storage electrode 114 has an upper surface, sidewall, and an upper edge 119 formed by junction of the upper surface and sidewall, wherein the upper edge may be formed at a right angle, with an angled or slanted shape, or with a rounded shape.

Next, an HSG silicon layer 118 is formed on storage electrode 114 to increase the effective surface area. More particularly, HSG silicon layer 118 is formed on only the upper surface and sidewall portion of storage electrode 114, but is not formed on upper edge 119. Subsequently, in order to finish fabrication of the DRAM cell capacitor, conventional process steps (not shown) are sequentially performed to form a dielectric layer and a capacitor plate electrode on storage electrode 114. Absent the HSG silicon layer 118 forming on upper edge 119 of storage electrode 114, the present invention addresses the problem of adjacent storage node shorting due to lifted HSG silicon.

In one embodiment of the present invention, upper edge 119 of storage electrode 114 has a slanting shape as shown in FIG. 3. However, in a variation of this embodiment, upper edge 119 may be formed with a right-angled shape.

Figure 4A:
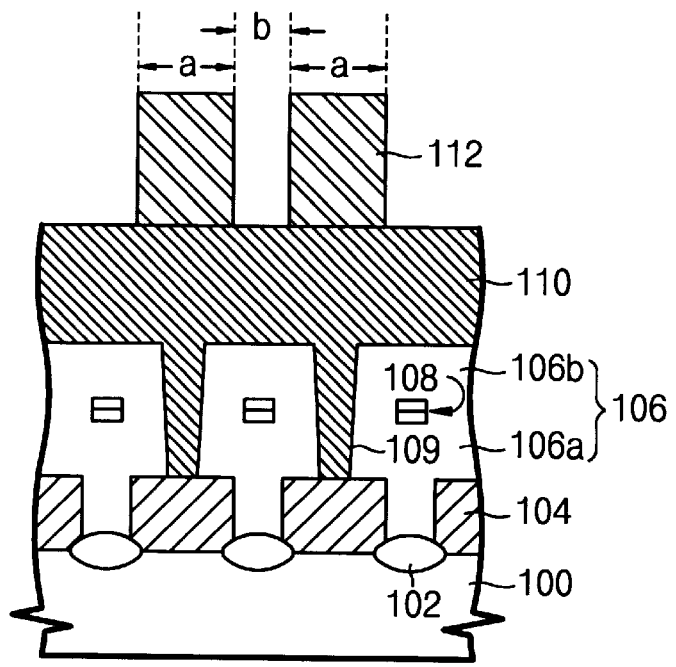
FIGS. 4A through 4E are flow diagrams showing the process steps of a novel method for manufacturing a DRAM cell capacitor according to a preferred embodiment of the present invention.

Hereinafter, a method for manufacturing the foregoing DRAM cell capacitor according to the present invention will be described in detail with reference to an embodiment illustrated by cross-sectional flow diagrams FIGS. 4A through 4E. In FIG. 4A, a semiconductor substrate 100 has already undergone several process steps. These steps include: forming device isolation regions 102, in this case a field oxide region, on semiconductor substrate 100. (One of ordinary skill in the art will appreciate that the terms "on" and "over," as in "form[ed, ing] on," or "form[ed, ing] over" connote the formation of a layer or structure directly on/over another layer or structure, or on/over the underlying layer or structure with additional layers formed therebetween). Device isolation regions 102 define active and inactive regions of substrate 100 and may be formed by a conventional method such as LOCOS (Local Oxidation of Silicon) or STI (shallow trench isolation). A pad electrode 104, preferably polysilicon, is formed on an active region, then an interlayer insulating layer 106, comprising constituent layer portions 106a and 106b, is formed over field oxide region 102 and pad electrode 104. In the embodiment shown in FIG. 4A, a bit line electrode 108 is formed within interlayer insulating layer 106.

By selectively etching interlayer insulating layer 106 until an upper surface of pad electrode 104 is exposed, a contact hole 109 is formed. Next, a conductive layer 110, preferably amorphous silicon, is deposited on interlayer insulating layer 106 so as to fill contact hole 109. Preferably, conductive layer 110 is formed to a thickness of about 9000 Å. A photoresist layer 112 is then formed and patterned over conductive layer 110 to define first region (a) and second region (b). Herein, first region (a) defines respective storage electrodes, and second region (b) defines a space between adjacent storage electrodes.

Using photoresist pattern 112 as a mask, a first etching process is performed to remove selected portions of conductive layer 110 to a thickness in the range of about 50 Å to 2000 Å, preferably several hundred Å. This etching process uses an enchant containing a fluorine gas, (i.e., a mixture of $CHF_3$ and argon (Ar) gases). In this embodiment, the etching process is performed using M×P etching equipment of AMT Co., Ltd. under the conditions that an inner pressure of the process chamber is about 100 mtorr, a power is about 300 Watt, a magnetic field is about 15 Gauss, a flow of $CHF_3$ gas is about 60 sccm, and a flow of argon gas is about 20 sccm.

Figure 4B:
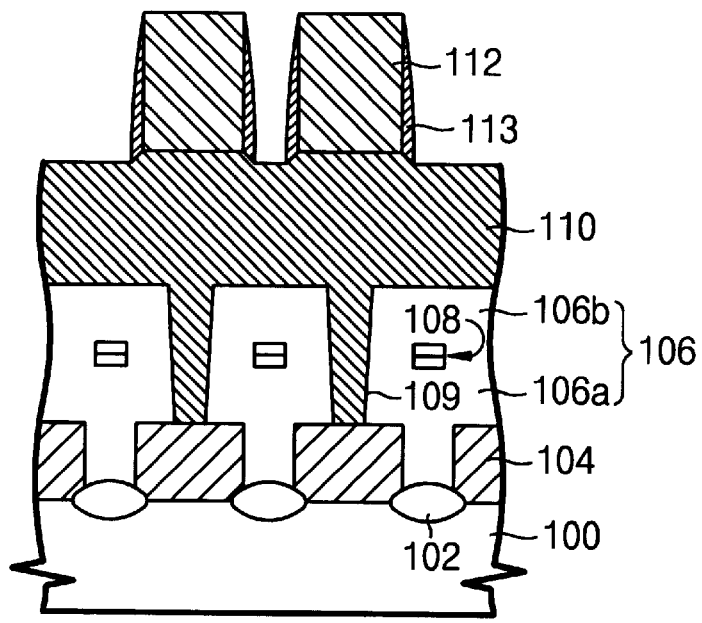

With reference to FIG. 4B, a polymer 113 is formed on the sidewall portion photoresist pattern 112. Conductive layer 110, as first etched, includes an angled portion. The "angled portion" as used herein refers to the etching displacement or transition between the storage electrode "upper surface" found under the photoresist pattern 112 and the portion of conductive layer 110 forming the upper edge found under polymer layer 113. The angled portion may have various actual shapes from slanted to round. As stated the angled portion, which later defines the upper edge of storage electrode 114, is formed under the bottom edge of the polymer 113. Actually, as can be seen from FIGS. 4C through 4E the angled portion of conductive layer 110, later angled top edge of storage node 114, is largely defined by the width of polymer 113, along with the characteristics of the irradiating beam discussed below. Of further note, the size of storage electrode 114 will increase with the width of polymer 113, and the space between adjacent storage electrodes will decrease accordingly. Thus, the overall size and final shape of storage electrode 114 is not limited by the definition of photoresist pattern 112.

Figure 4C:
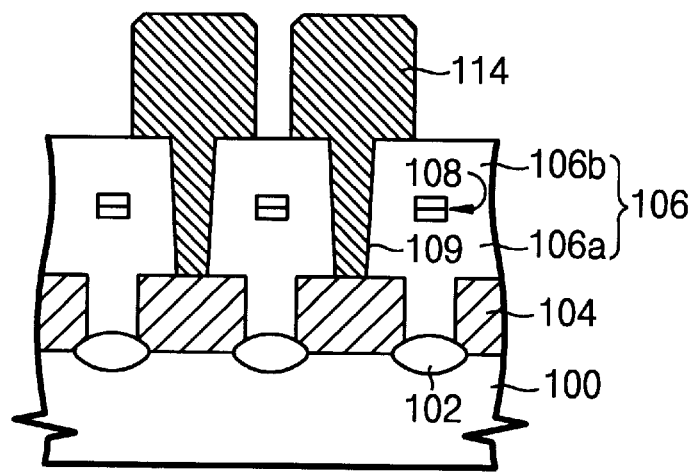

Next, a second etching process of conductive layer 110 is performed using the combination of patterned photoresist layer 112 and polymer 113 as a mask. The second etching process continues until an upper surface of the interlayer insulating layer 106 is exposed, and thereby storage electrode 114 is formed, as shown in FIG. 4C. The second etching process is performed using tcp etching equipment of LRC Co., Ltd. under the conditions that an inner pressure of the process chamber is about 5 mtorr, a source power is about 600 Watt, a low power is about 50 Watt, a flow of $Cl_2$ gas is about 40 sccm, a flow of $SF_6$ gas is about 5 sccm, and a flow of $N_2$ gas is about 6 sccm. Alternatively, the second etching process is performed using M×P etching equipment of AMT Co., Ltd. under the conditions that an inner pressure of the process chamber is about 120 mtorr, a power is about 450 Watt, a magnetic field is about 40 Gauss, a flow of HBr gas is about 60 sccm, and a flow of $Cl_2$ gas is about 20 sccm.

Alternatively, upper edge 119 of storage electrode 114 may be formed at a right-angled shape using a conventional anisotropic etching process.

Figure 4D:
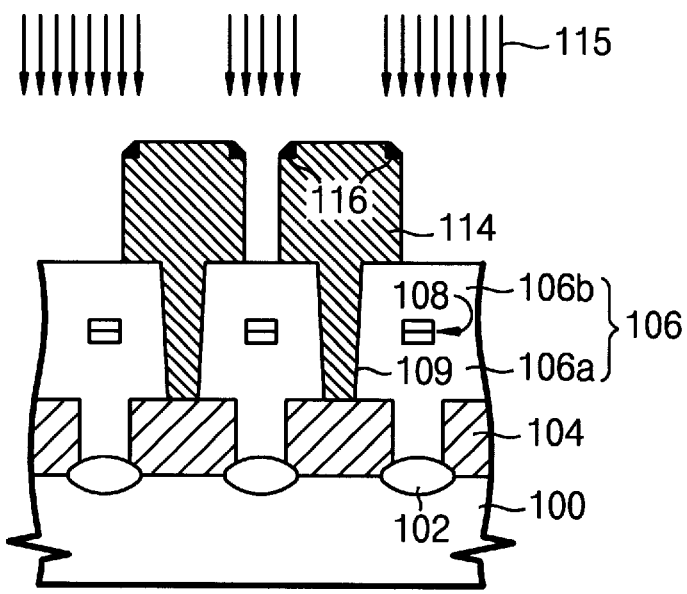

Next, as illustrated in FIG. 4D, a high energy beam 115 is irradiated onto top edge 119 of storage electrode 114 using a Cr pattern blind mask, to thereby recrystallize the irradiated surface of conductive layer 110, i.e., to convert the irradiated surface of the amorphous silicon into polysilicon 116. The thickness of the resulting polysilicon 116 is about 50 Å to 2000 Å, and preferably several hundred Å. The high energy beam 115 may be an In Line SEM or an E-beam.

The photoresist pattern 112 and the polymer 113 are removed using an oxygen plasma ashing and $H_2SO_4$ stripping process well-known in the art. The substrate is then washed by dipping it in a washing liquid, such as a mixture of $NH_3$, $H_2O_2$, and deionized water (i.e., SC-1 solution).

Figure 4E:
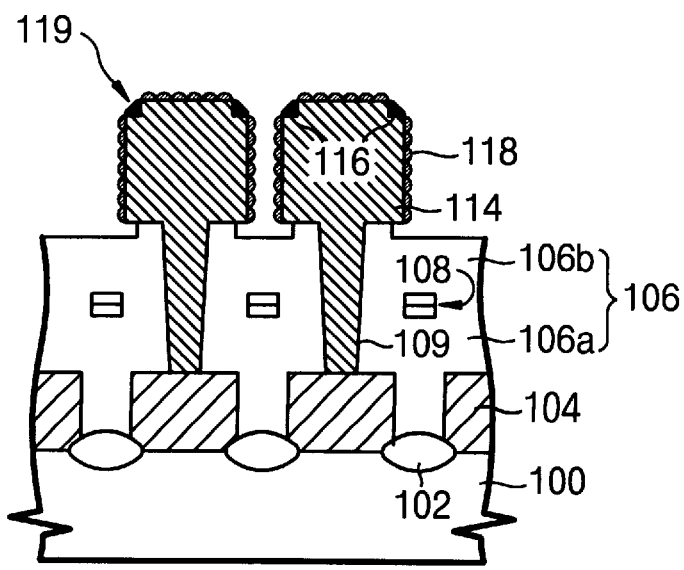

Finally, as shown in FIG. 4E, a HSG (Hemi-Spherical Grain) forming process well-known in this art is performed to obtain a wider effective surface area of the capacitor storage electrode 114. The HSG silicon layer 118 formed on storage electrode 114 has an unevenness or roughness to its surface. Of note, during the HSG forming process, HSG silicon layer 118 does not form on top edges 119 of storage electrode 114 because upper edge 119 has previously been recrystallized by the aforementioned irradiation step.

Subsequently, a portion of interlayer insulating layer 106 proximate the bottom of storage electrode 114 is removed by etching to expose a bottom edge portion of storage electrode 114, thereby increasing the effective surface area of storage electrode 114, as shown in FIG. 4E. The etching of interlayer insulating layer 106 is performed using a washing liquid which is a mixture of La1 solution (a mixture of $NH_4F$ and HF) and SC-1 solution. Alternatively, the etching of the interlayer insulating layer 106 can be performed using only the La1 solution.

Next, after the semiconductor substrate 100 wherein the HSG silicon layer 118 is already formed is washed by using the washing liquid, for example, SC-1 and HF solution, or HF solution only, a capacitor dielectric layer (not shown) such as oxide, nitride or the like is formed. Also, a capacitor plate electrode (not shown) is formed on the capacitor dielectric layer. With these conventional steps, the improved DRAM cell capacitor is finished.

Figure 5A:
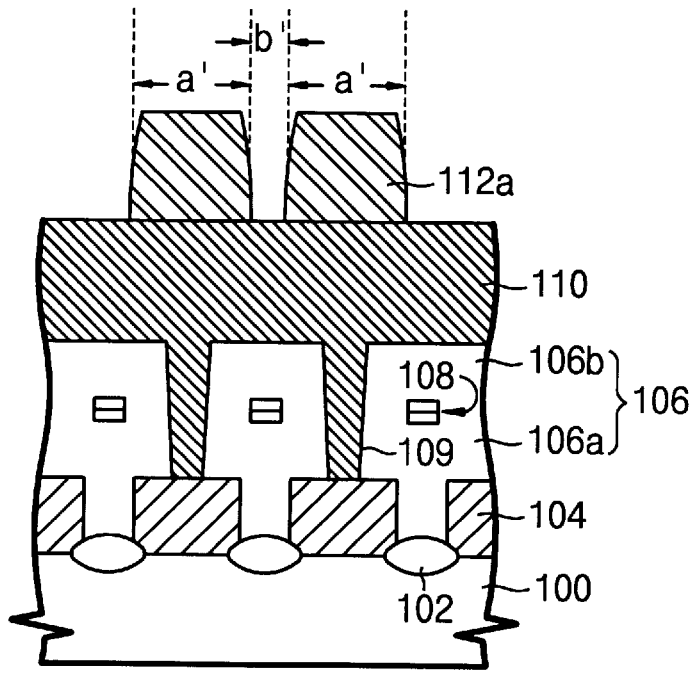
FIGS. 5A through 5B are flow diagrams showing the process steps of a method for manufacturing a DRAM cell capacitor having a right-angled shape at its top edges according to a variation of the preferred embodiment of the present invention.
Figure 5B:
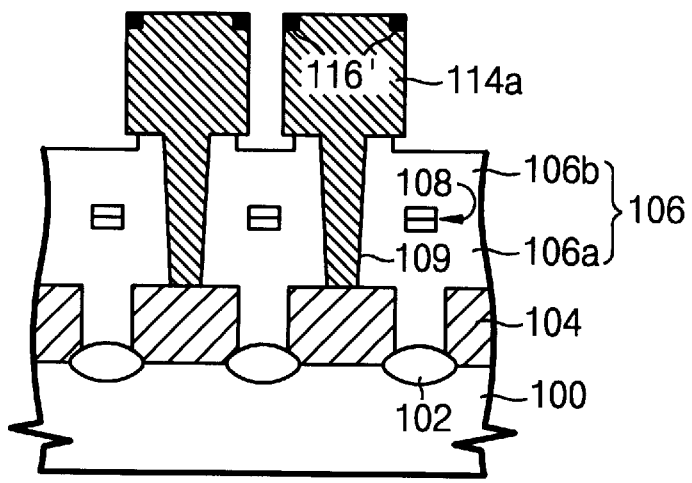

Alternatively, instead of forming polymer 113 on photoresist pattern 112 shown in FIG. 4B, photoresist pattern 112 can be reflowed. This is illustrated in FIGS. 5A and 5B. In FIG. 5A, the process steps before forming the photoresist pattern are the same as that described above with reference to FIG. 4A. Hence, their explanation is omitted here, but similar numbers are used to indicate similar elements previously described.

After forming photoresist pattern 112, it is reflowed to thereby form a reflowed photoresist pattern 112a having increased width (a'), as compared with width (a) shown in FIG. 4A, and decreased space between adjacent storage electrodes (b') as compared with (b) shown in FIG. 4A. Conductive layer 110 is then etched using reflowed photoresist pattern 112a as a mask to form a storage electrode 114a, as shown in FIG. 5B. In this embodiment, the etching process is performed using a conventional anisotropic etching technique to form storage electrode 114a having right-angled shaped top edges. Subsequent process steps follow hereafter as previously described with reference to FIGS. 4D and 4E.

Figure 6A:
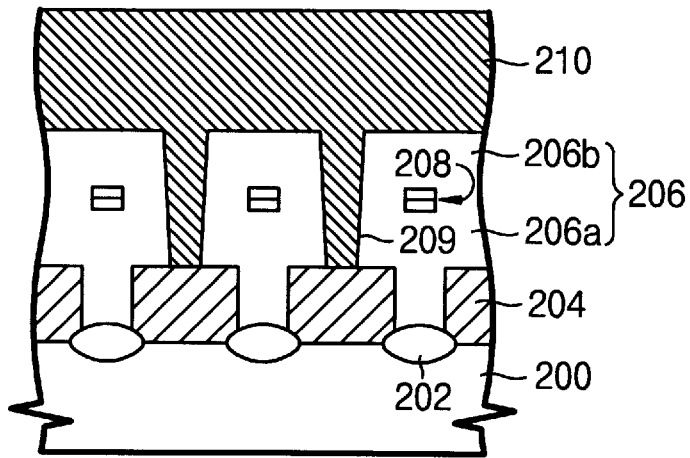
FIGS. 6A through 6F are flow diagrams showing the process steps of a novel method for manufacturing a DRAM cell capacitor having an angled shape at its top edges according to another embodiment of the present invention.

FIGS. 6A to 6F are flow diagrams showing the process steps for a method of manufacturing a DRAM cell capacitor having an angled shape at its top edges according to another embodiment of the present invention. FIG. 6A is, in cross-section, a portion of a semiconductor substrate 200 having already undergone several process steps.

These steps include: forming device isolation regions 202, in this case a field oxide region, on the semiconductor substrate. Device isolation regions 202 define active and inactive regions of substrate 200 and may be formed by a conventional method such as LOCOS or STI. A pad electrode 204, preferably polysilicon, is formed on an active region, then an interlayer insulating layer 206, comprising constituent layer portions 206a and 206b, is formed over field oxide region 202 and pad electrode 204. In the embodiment shown in FIG. 6A, a bit line electrode 208 is formed within interlayer insulating layer 206.

By selectively etching interlayer insulating layer 206 until an upper surface of pad electrode 204 is exposed, a contact hole 209 is formed. Next, a conductive layer 210, preferably amorphous silicon, is deposited on interlayer insulating layer 206 so as to fill contact hole 209. Preferably, conductive layer 210 is formed to a thickness of about 9000 Å.

Figure 6B:
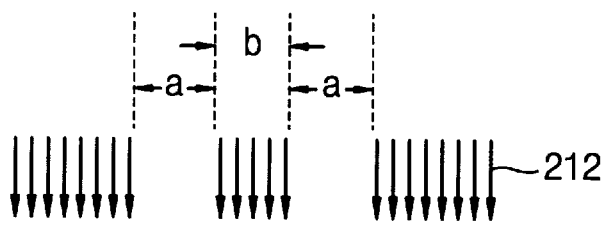
Figure 6B:
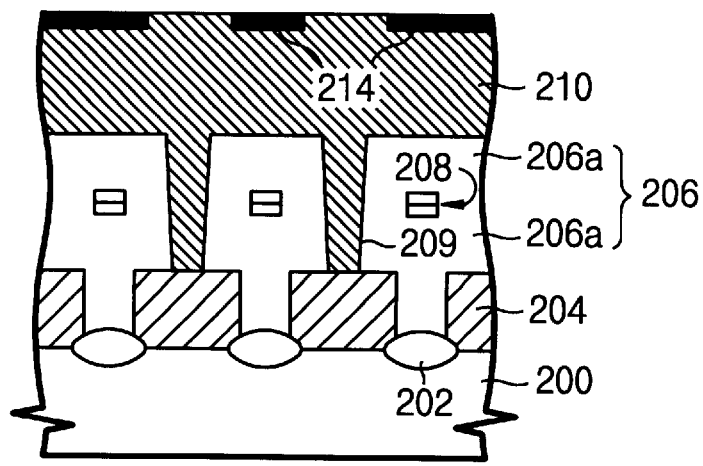

After forming conductive layer 210 over interlayer insulating layer 206 to fill contact hole 209, a first region (a) and a second region (b) are defined on conductive layer 210 as shown in FIG. 6B. The first region (a) defines the width of respective storage electrodes and the second region (b) defines a space between adjacent storage electrodes.

Using the Cr pattern blind mask, a high energy beam 212 is irradiated into the predetermined regions, i.e., the second region (b) and edge portion of the first region (a), and thereby recrystallizing the irradiated regions, i.e., converting these regions into polysilicon regions 214. The thickness of polysilicon regions 214 is about 50 Å to 2000 Å, and preferably several hundred Å. The high energy beam 212 may be an In Line SEM or E-beam.

Figure 6C:
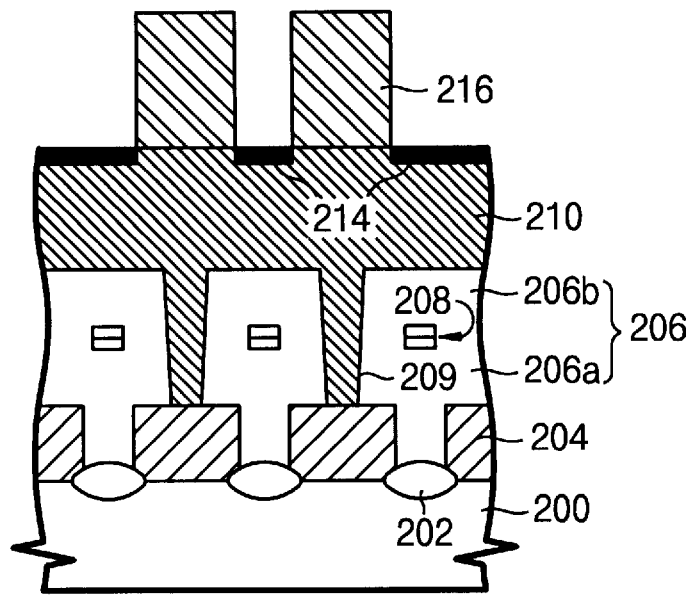

Next, referring to FIG. 6C, a photoresist pattern 216 is formed over conductive layer 210 to cover the first region (a) in order that the polysilicon on the edge portion of the first region is overlapped by photoresist pattern 216. Using the photoresist pattern 216 as a mask, a first etching process is performed to remove conductive layer 210 to a thickness in the range of about 50 Å to 2000 Å, preferably several hundred Å. This etching process uses an enchant containing a fluorine gas, (i.e., a mixture of $CHF_3$ and argon (Ar) gases). In this embodiment, the etching process is performed using M×P etching equipment of AMT Co., Ltd. under the conditions that an inner pressure of the process chamber is about 100 mtorr, a power is about 300 Watt, a magnetic field is about 15 Gauss, a flow of $CHF_3$ gas is about 60 sccm, and a flow of argon gas is about 20 sccm.

Figure 6D:
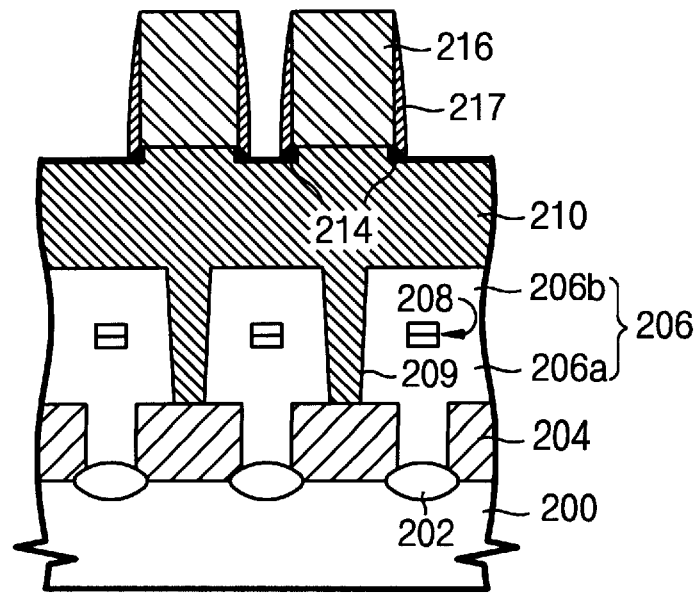

With reference to FIG. 6D, as etched, conductive layer 210 includes angled portions formed under the bottom edges of photoresist pattern 216. Like above, a polymer 217 is formed on the sidewalls of photoresist pattern 216. Of note, these angled portions become the top edge of the ultimately formed storage electrode. The angled portions of conductive layer 210 may be slanted or rounded by the first etching of conductive layer 210 at the bottom edges of the patterned photoresist layer 216.

Figure 6E:
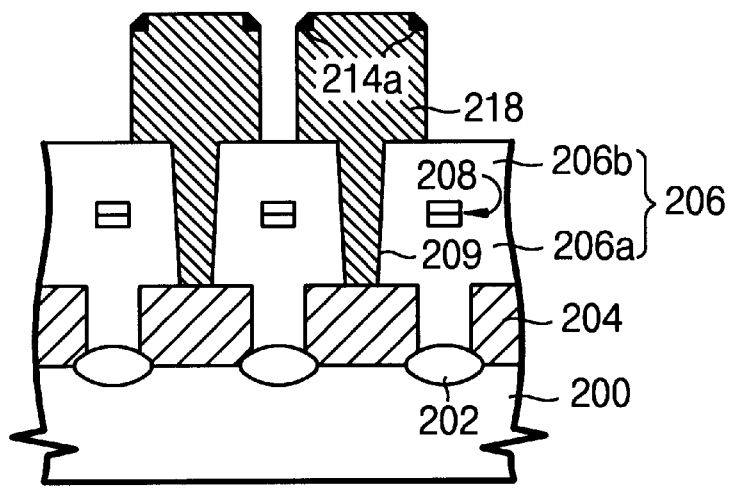

Next, a second etching process of the remaining, first etched, conductive amorphous silicon 210 is performed using a combination of photoresist pattern 216 and polymer 217 as a mask until an upper surface of the interlayer insulating layer 206 is exposed to thereby form storage electrode 218, as shown in FIG. 6E. The second etching process is performed using tcp etching equipment of LRC Co., Ltd. under the conditions that an inner pressure of the process chamber is about 5 mtorr, a source power is about 600 Watt, a low power is about 50 Watt, a flow of $Cl_2$ gas is about 40 sccm, a flow of $SF_6$ gas is about 5 sccm, and a flow of $N_2$ gas is about 6 sccm. Alternatively, the etching process is performed using M×P etching equipment of AMT Co., Ltd. under the conditions that an inner pressure of the process chamber is about 120 mtorr, a power is about 450 Watt, a magnetic field is about 40 Gauss, a flow of HBr gas is about 60 sccm, and a flow of $Cl_2$ gas is about 20 sccm. Alternatively, the top edges of the storage electrode may be formed to have a right-angled shape by a conventional anisotropic etching process. After removing the photoresist pattern 216 and the polymer 217 using a oxygen plasma ashing and $H_2SO_4$ stripping process that is well-known in the art, the substrate is washed by dipping it in a washing liquid, such as a mixture of $NH_3$, $H_2O_2$, and deionized water (i.e., the SC-1 solution).

Figure 6F:
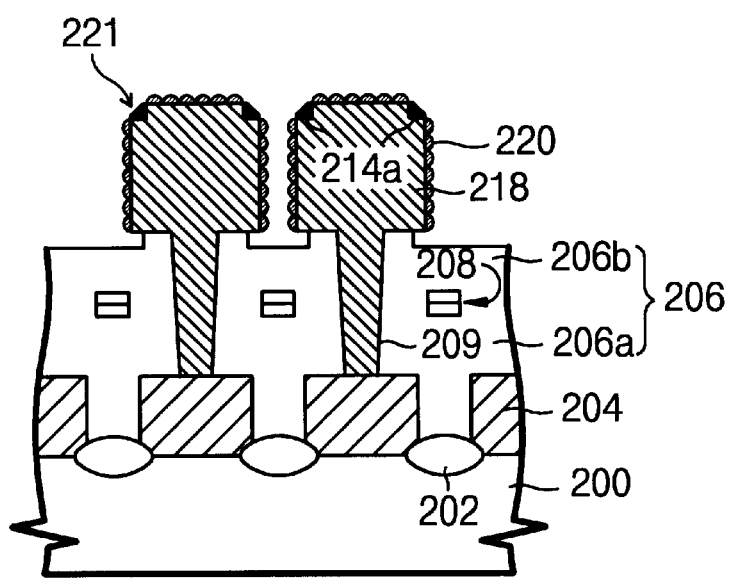

Finally, as shown in FIG. 6F, a HSG (Hemi-Spherical Grain) forming process well-known in this art is performed to obtain a wider effective surface area of storage electrode 218. As a result, an HSG silicon layer 220 formed on storage electrode 218 has unevenness or roughness on its surface. Herein, it is an important feature of the present invention that, during the HSG forming process, the HSG silicon layer 220 is not formed on top edges 221 of storage electrode 218 because top edges 221 of storage electrode 218 have already been recrystallized by the aforementioned irradiation.

Subsequently, a portion of interlayer insulating layer 206 which is at the bottom of storage electrode 218 is removed by etching, thereby increasing the effective surface area of storage electrode 218, as shown in FIG. 6F. The etching of interlayer insulating layer 206 is performed using washing liquid which is a mixture of La1 solution (a mixture of $NH_4F$ and HF) and SC-1 solution. Alternatively, the etching of interlayer insulating layer 206 can be performed using only the La1 solution.

Next, after semiconductor substrate 100, upon which HSG silicon layer 220 has been formed, is washed by using the washing liquid, for example, SC-1 and HF solution, or HF solution only, a capacitor dielectric layer (not shown) such as oxide, nitride or the like is formed. Also, a capacitor plate electrode (not shown) is formed on the capacitor dielectric layer. As a result, the DRAM cell capacitor is completely fabricated.

Alternatively, instead of forming polymer 217 shown in FIG. 6D, in a variation embodiment, the photoresist pattern 216 can be reflowed like the first embodiment.

Figure 7A:
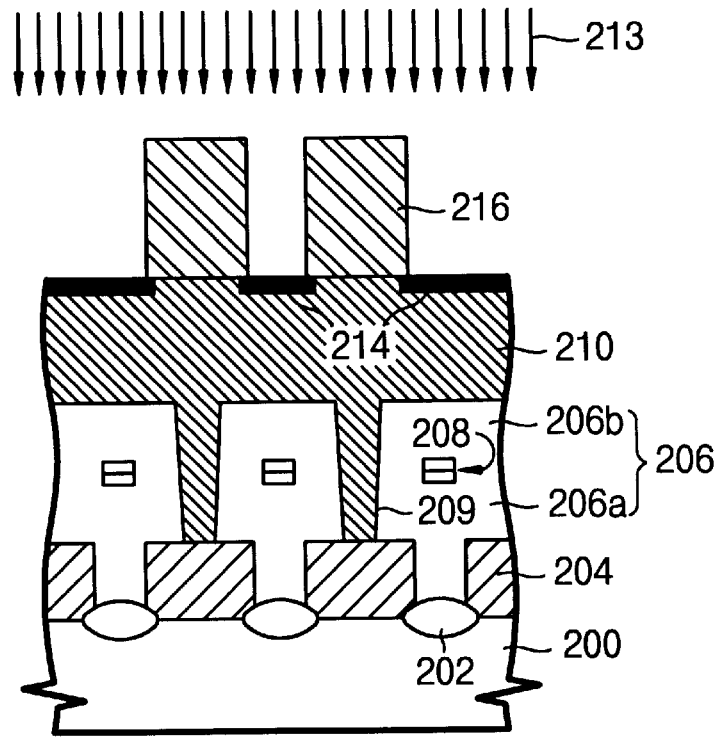
FIGS. 7A through 7B are flow diagrams showing the process steps of a novel method for manufacturing a DRAM cell capacitor having a right-angled shape at its top edges according to yet another embodiment of the present invention.
Figure 7B:
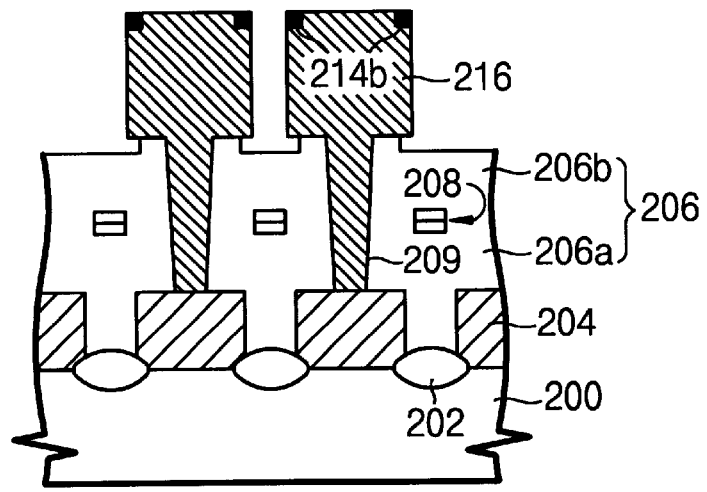

FIGS. 7A and 7B are flow diagrams showing the process steps of a method for manufacturing a DRAM cell capacitor having a right-angled shape top edge on the storage electrode according to another embodiment of the present invention. In FIGS. 7A and 7B, the like parts are identified by numbers as shown in FIGS. 6A through 6F and their explanation is omitted here.

Referring to FIG. 7A, after forming conductive layer 210, photoresist pattern 216 is formed thereon. Next, a high energy beam 213 is irradiated into conductive layer 210 using photoresist pattern 216 as a mask to thereby recrystallize exposed portions of conductive layer 210, i.e., converting these portions into polysilicon 214. The thickness of polysilicon 214 is about 50 Å to 2000 Å, and preferably several hundred Å. Herein, high energy beam 213 is one that cannot penetrate the photoresist pattern 216 so as to recrystallize desired portion of conductive layer 210, such as In Line SEM. Alternatively, an E-beam can be employed with a Cr pattern blind mask.

The next process steps are the same those previously discussed. Namely, conductive layer 210 may be etched using the photoresist patten and the polymer as a mask (as illustrated in FIGS. 6D and 6E) or by using reflowed photoresist pattern as a mask. FIG. 7B illustrates storage electrode 216 which is formed using a reflowed photoresist pattern as a mask thereby having a right-angled shaped at its top edges.

Figure 8:
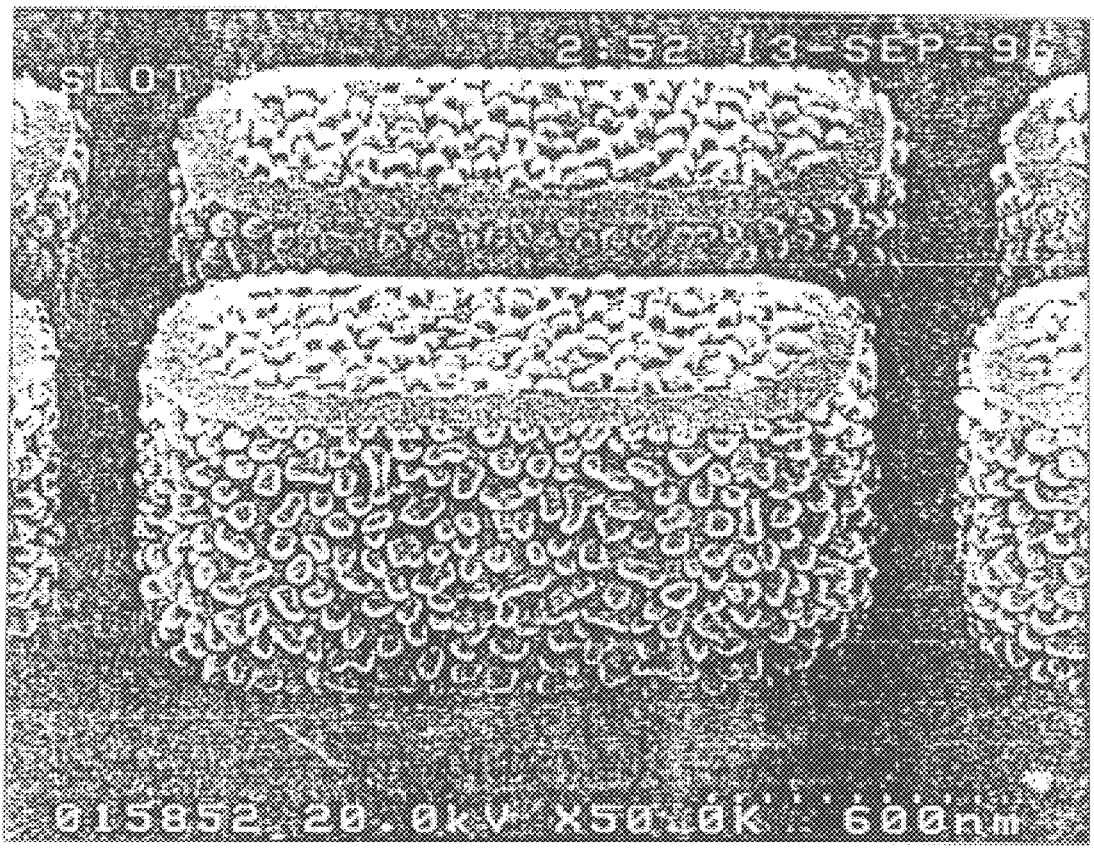
FIG. 8 is a SEM showing the top edges of the capacitor storage electrode manufactured according to the present invention.

FIG. 8 shows in a scanning electron microphotograph (SEM) the top edges of the storage electrode manufactured in accordance with the present invention.

Referring to FIG. 8, although a part of the HSG silicon layer is lifted from the surfaces of the capacitor storage electrode during the etching and washing process, a short-circuit between adjacent storage electrodes, which has been frequently generated by the HSG silicon layer lifted from the top edges of the capacitor storage electrode, does not occur. This is because the HSG silicon layer is not formed on the top edges of the capacitor storage electrode due to the recrystallization thereof.

Figure 9:
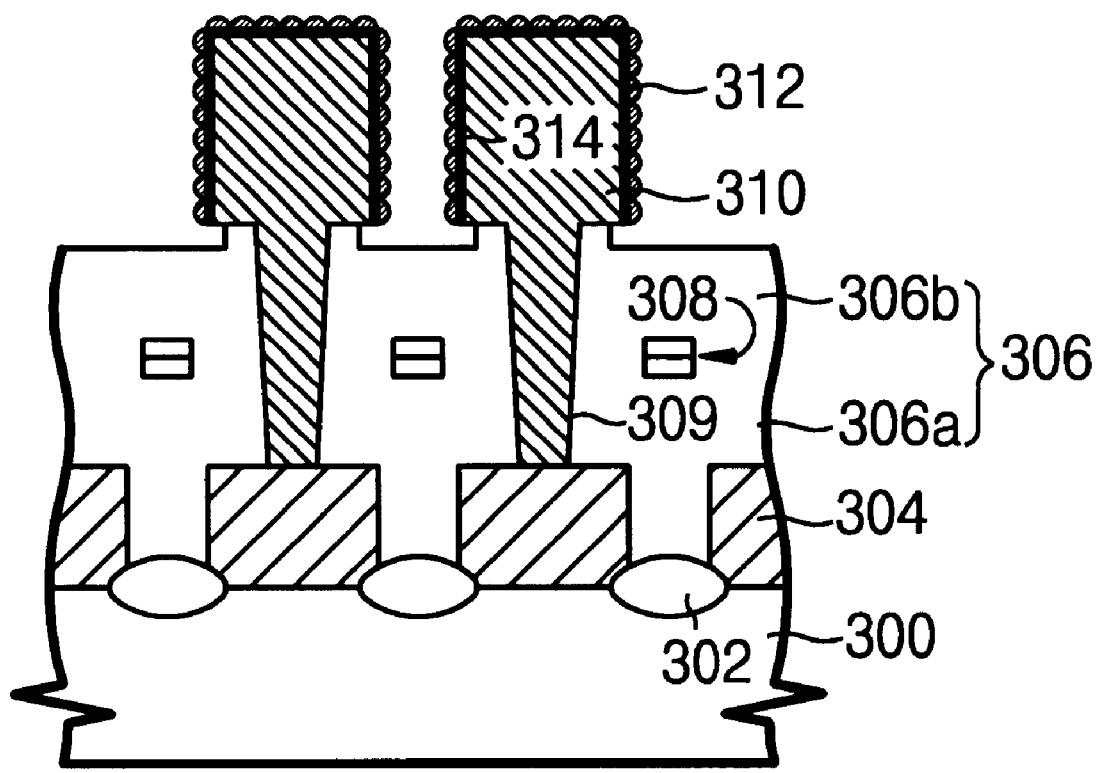
FIG. 9 is a cross-sectional view of a novel DRAM cell capacitor manufactured according to still another embodiment of the present invention.

Finally, FIG. 9 is a cross-sectional view of a DRAM cell capacitor manufactured to yet another embodiment of the present invention.

Figure 1:
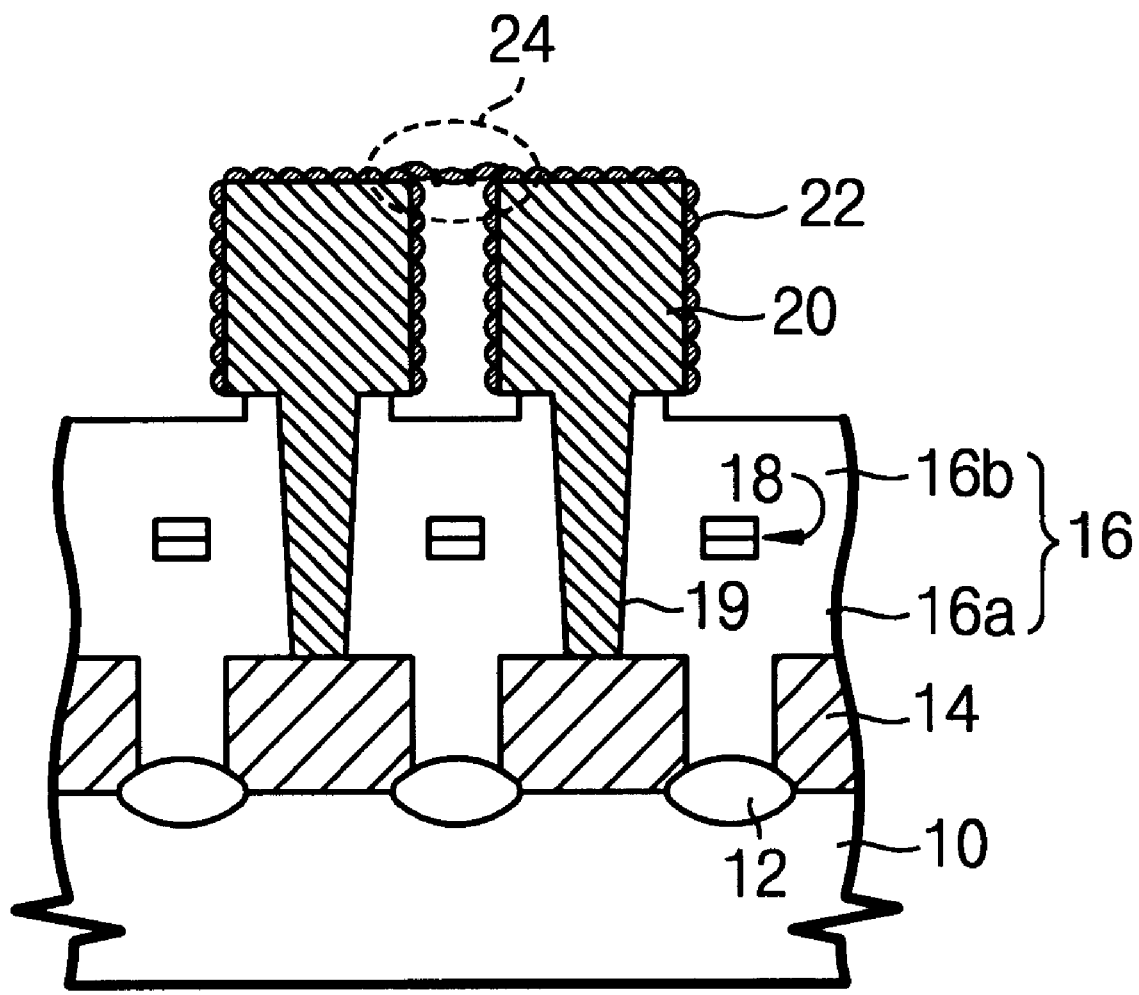
FIG. 1 is a cross-sectional view of a conventional DRAM cell capacitor.
Figure 2A:
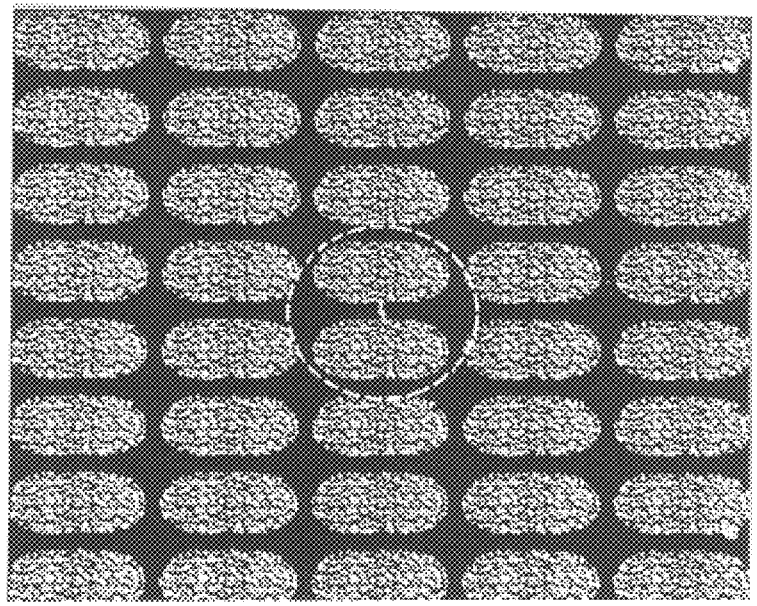
FIG. 2A is a scanning electron microphotograph (SEM) showing a plan view of the conventional DRAM cell capacitor array.
Figure 2B:
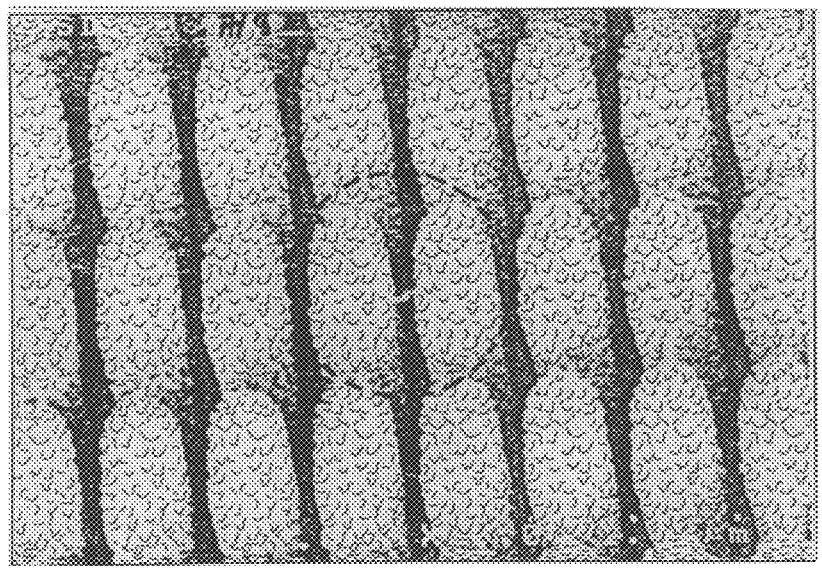
FIG. 2B is a SEM showing a perspective view of the conventional DRAM cell capacitor array shown in FIG. 2A.

In this embodiment, like the conventional method previously described with reference to FIG. 1, after forming storage electrode 310, the HSG layer 312 is formed on the storage electrode 310. Up to this step the process is the same as the conventional method process, but the following step is novel. After forming the HSG layer 312, a plasma treatment process is performed so as to recrystallize surface layer 314 of storage electrode 310. Due to this recrystallizaiton, the amorphous silicon, preferably forming storage electrode 310, is converted into the polysilicon and the resistance of storage electrode 310 is reduced. The plasma treatment may be $PH_3$ plasma doping process. Because the polysilicon is more resistant to the SC-1 solution than the amorphous silicon, the HSG silicon is not easily lifted from the storage electrode compared with the conventional method. Thus, the possibility of shorting bridges between adjacent storage electrodes can be minimized.

Thus, the present invention provides the advantage of capacitor storage electrodes, which can prevent them from being short-circuited due to some HSG lifted from top edges of them during etching and washing process after formation of HSG.

The foregoing embodiments have been given by way of example. The present invention is not limited to these embodiments, but is defined by the attached claims. One of ordinary skill in the art will appreciate that modifications and changes may be made to the foregoing without departing from the scope of the attached claims.

What is claimed is:

1. A method of manufacturing a storage electrode for a DRAM cell capacitor, the storage electrode being formed on an interlayer insulating layer and being electrically connected to a pad electrode formed on a semiconductor substrate through a contact hole in the interlayer insulating layer, the method comprising the steps of:

forming a conductive layer comprising amorphous silicon over the interlayer insulating layer;

forming a photoresist pattern over the conductive layer to define first and second regions on the conductive layer;

within the second region, converting the conductive layer into polysilicon;

etching the conductive layer to form the storage electrode having sidewalls, an upper surface, and a polysilicon edge portion proximate the joining of the upper surface and sidewalls; and forming an HSG silicon layer over the upper surface and sidewalls of the storage electrode, wherein the HSG silicon layer is not formed over the polysilicon edge portion.

2. The method of claim 1, wherein the step of converting the second region of the conductive layer into polysilicon comprises the step of irradiating the second region of the conductive layer with a high energy beam.

3. The method of claim 2, wherein the high energy beam is one selected from a group of consisting of an in-line scanning electron microscope and an electron beam.

4. The method of claim 1, wherein after the step of forming the photoresist pattern further comprises reflowing the photoresist pattern such that a first width of a bottom portion of the photoresist pattern proximate the conductive layer is slightly greater than a second width of an upper portion of the photoresist pattern.

5. The method of claim 1, wherein the step of etching the conductive layer comprises:

forming a polymer layer on sidewalls of the photoresist pattern while performing a first etching to form a surface comprising an angled portion underlying a bottom edge portion of the polymer layer;

performing a second etching of the conductive layer using the photoresist pattern and polymer layer as a mask to form the storage electrode having sidewalls, and upper surface, and a polysilicon edge portion joining the upper surface and sidewalls, wherein the upper edge is formed from the angled portion.

* * * * *